(12) United States Patent
Sakata et al.

(10) Patent No.: US 7,898,798 B2
(45) Date of Patent: Mar. 1, 2011

(54) HEAT DISSIPATING STRUCTURE FOR ELECTRONIC COMPONENT AND DISPLAY DEVICE

(75) Inventors: Tatsuya Sakata, Tokyo (JP); Toru Yamauchi, Kanagawa (JP); Kenichi Seki, Tokyo (JP); Terutaka Yana, Tokyo (JP)

(73) Assignee: Sony Corporation, Tokyo (JP)

( * ) Notice: Subject to any disclaimer, the term of this patent is extended or adjusted under 35 U.S.C. 154(b) by 28 days.

(21) Appl. No.: 12/325,059

(22) Filed: Nov. 28, 2008

(65) Prior Publication Data
US 2009/0141450 A1    Jun. 4, 2009

(30) Foreign Application Priority Data
Nov. 29, 2007  (JP) .................................. 2007-308282

(51) Int. Cl.
*H05K 7/20*    (2006.01)

(52) U.S. Cl. .................... 361/679.47; 361/695; 361/697; 165/80.3

(58) Field of Classification Search ............. 361/679.46, 361/679.47, 679.52, 679.54, 690–697, 715, 361/719, 701, 700; 165/80.2, 80.3, 80.4, 165/80.5, 119, 121, 122, 104.33, 104.34, 165/185; 174/15.1, 16.3, 252; 257/E23.088, 257/E23.099
See application file for complete search history.

(56) References Cited

U.S. PATENT DOCUMENTS

| | | | | |
|---|---|---|---|---|
| 5,299,632 A | * | 4/1994 | Lee | 165/80.3 |
| 5,495,392 A | * | 2/1996 | Shen | 361/697 |
| 5,566,749 A | * | 10/1996 | Jordan et al. | 165/80.3 |
| 5,664,624 A | * | 9/1997 | Tsai et al. | 165/80.3 |
| 6,302,189 B1 | * | 10/2001 | Lin et al. | 165/80.3 |
| 7,405,933 B2 | * | 7/2008 | Kobayashi et al. | 361/695 |
| 7,515,414 B2 | * | 4/2009 | Horng | 361/697 |

FOREIGN PATENT DOCUMENTS

| | | | |
|---|---|---|---|
| JP | 11087962 A | * | 3/1999 |
| JP | 2001-14067 | | 1/2001 |
| JP | 2002-76664 | | 3/2002 |
| JP | 2005-243925 | | 9/2005 |
| KR | 200300661 A | * | 7/2001 |

OTHER PUBLICATIONS

U.S. Appl. No. 12/251,803, filed Oct. 15, 2008, Sakata.

* cited by examiner

*Primary Examiner* — Michael V Datskovskiy
(74) *Attorney, Agent, or Firm* — Oblon, Spivak, McClelland, Maier & Neustadt, L.L.P.

(57) ABSTRACT

A heat dissipating structure for an electronic component of the present invention includes a main board on which electronic components are mounted, a heat sink disposed facing the main board and contacting a plurality of the electronic components on the main board, a heat pipe disposed on the heat sink, an arm branching from the heat sink and elastically deformable in relation to the heat sink, and a cooling fan located at the end portion of the heat pipe.

11 Claims, 8 Drawing Sheets

HEAT DISSIPATING STRUCTURE FOR ELECTRONIC COMPONENT AND DISPLAY DEVICE

CROSS REFERENCES TO RELATED APPLICATIONS

The present invention contains subject matter related to Japanese Patent Application JP 2007-308282 filed in the Japan Patent Office on Nov. 29, 2007, the entire contents of which being incorporated herein by reference.

BACKGROUND OF THE INVENTION

1. Field of the Invention

The present invention relates to a heat dissipating structure for an electronic component and a display device.

2. Description of the Related Art

In related art, in a personal computer, for example, to suppress heat emitted by an electronic component disposed in the main body thereof, heat emitted by a specific electronic component is transferred by using a heat pipe to a cooling fan to be dissipated as described in JP-A-2002-76664.

SUMMARY OF THE INVENTION

However, in a display device of a small television receiver, for example, a large number of electronic components are densely disposed inside the main body, each electronic component individually emitting heat, and thus, resulting in a large number of heat-emitting components existing in mixture inside the main body. In such a case, when trying to dissipate the heat emitted by each electronic component with a heat pipe, the arrangement of the heat pipes becomes complicated, making difficult to efficiently dissipate heat. Thus, particularly in a small television receiver or the like, there occurs a problem that the temperature inside the main body of the display device easily rises.

Further, when dissipating heat by using a cooling fan, it is desirable that the noise caused by the driving of the cooling fan is suppressed to the minimum. Particularly, when the housing in which the electronic components are disposed is small, it is assumed that the vibration of the cooling fan is imparted to the entire exterior and a sound caused by the vibration is transmitted to the outside of the housing. Accordingly, a method is conceived of fitting the cooling fan to a support portion for the cooling fan of the housing or the like with a vibration absorbing material such as vibration absorbing rubber in between. However, with the method of attaching a rubber cushion at the fitting portion for the cooling fan, a comparatively large area is required for the space of the rubber cushion, and thus, it is particularly not suited for a small device. Further, with the method of attaching a rubber cushion, there is a problem that the number of components increases and the procedure of fitting the cooling fan becomes complicated.

Consequently, the present invention has been made in view of the foregoing, and it is desirable to provide a new and improved display device with a simple structure and which is capable of improving the quietness of the cooling fan for heat dissipation.

According to an embodiment of the present invention, there is provided a heat dissipating structure for an electronic component, including a circuit board on which electronic components are mounted, a heat sink disposed facing the circuit board, an arm branching from the heat sink and elastically deformable in relation to the heat sink, and a cooling fan attached to the arm and connected to the heat sink.

With the above structure, the heat sink is disposed facing the circuit board on which electronic components are mounted, the cooling fan is attached to the arm branching from the heat sink and elastically deformable in relation to the heat sink, and thus, the cooling fan is connected to the heat sink. Accordingly, the vibration caused by driving the fan is absorbed by the elastically deformable arm, and thus, it becomes possible to reduce the noise caused by the driving of the cooling fan.

Further, a heat pipe may be disposed on the heat sink, wherein the cooling fan is located at the end portion of the heat pipe. With such structure, heat of the heat sink is transferred to the cooling fan through the heat pipe, and thus, it becomes possible to efficiently dissipate the heat.

Further, the heat sink may be connected with a plurality of the electronic components on the circuit board. With such structure, heat of the electronic components is transferred to the heat sink, and thus, it becomes possible to dissipate the heat emitted by the electronic components.

Further, a groove may be formed along the outer edge of the heat sink, and a predetermined portion of the heat sink between the groove and the outer edge of the heat sink may be made to be the arm. With such structure, the heat sink and the arm can be configured by the same material member, and thus, it becomes possible to reduce the manufacturing cost.

Further, an opening for exposing blades of the cooling fan may be provided in the heat sink, and the groove may be provided between the opening and the outer edge of the heat sink. With such structure, the groove is provided between the opening and the outer edge of the heat sink, and thus, it becomes possible to provide the arm around the opening.

Further, a cushion member inserted between the heat sink and the cooling fan may be further provided. With such structure, it becomes possible to reduce the noise generated at the time of the heat sink and the cooling fan coming into contact due to the vibration.

According to another embodiment of the present invention, there is provided a display device including a body stand portion, a display portion, and a support portion provided in a standing manner on the body stand portion and which supports the display portion, the display device including a circuit board provided inside the body stand portion and on which electronic components are mounted, a heat sink disposed facing the circuit board, an arm branching from the heat sink and elastically deformable in relation to the heat sink, and a cooling fan attached to the arm and connected to the heat sink.

With the above structure, in the display device including the body stand portion, the display portion, and the support portion provided in a standing manner on the body stand portion and which supports the display portion, the circuit board on which electronic components are mounted is provided inside the body stand portion, and the heat sink is disposed facing the circuit board. Also, the cooling fan is attached to the arm branching from the heat sink and elastically deformable in relation to the heat sink, and thus, the cooling fan is connected to the heat sink. Accordingly, the vibration caused by driving the fan is absorbed by the elastically deformable arm, and thus, it becomes possible to reduce the noise caused by the driving of the cooling fan.

According to the present invention, a display device with a simple structure, capable of improving the quietness of a cooling fan for heat dissipation can be provided.

DETAILED DESCRIPTION OF THE PREFERRED EMBODIMENTS

Figure 1A:
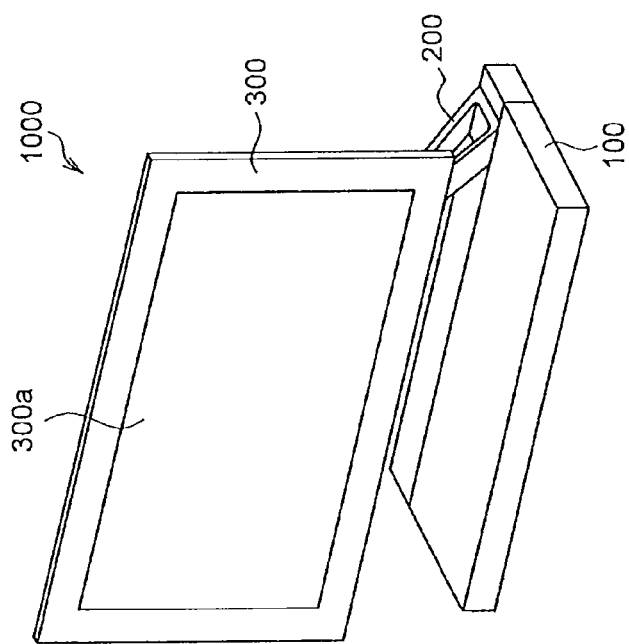
FIGS. 1A and 1B are schematic perspective views showing appearances of a display device according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

[Overall Structure of Display Device]

Figure 1B:
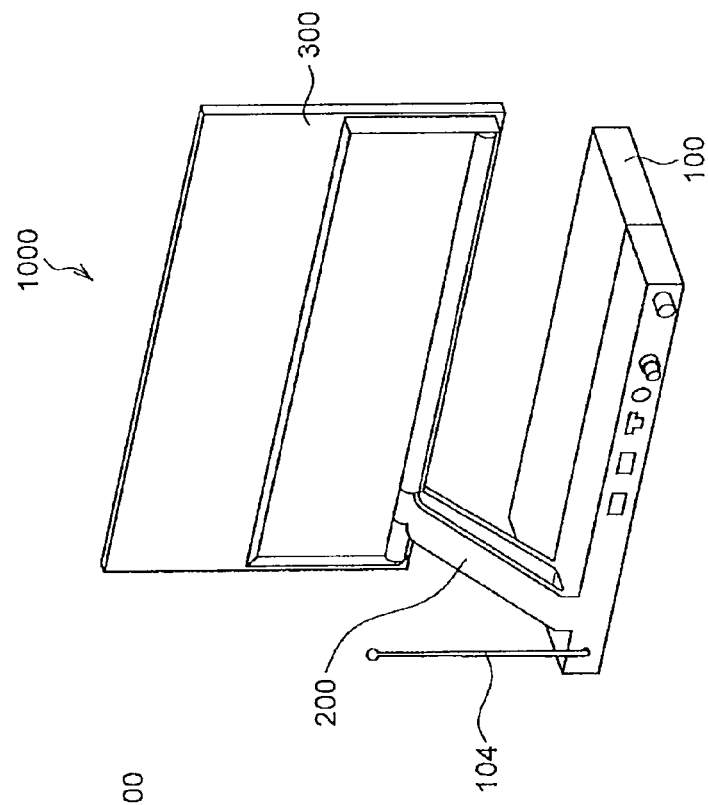

FIGS. 1A and 1B are schematic perspective views showing appearances of a display device 1000 according to an embodiment of the present invention. Here, FIG. 1A is a schematic perspective view showing the display device 1000 seen from the front upper right. Further, FIG. 1B is a schematic perspective view showing the display device 1000 seen from the back upper right. Further, FIG. 2 is a schematic perspective view showing the display device 1000 seen from the front left side.

Figure 2:
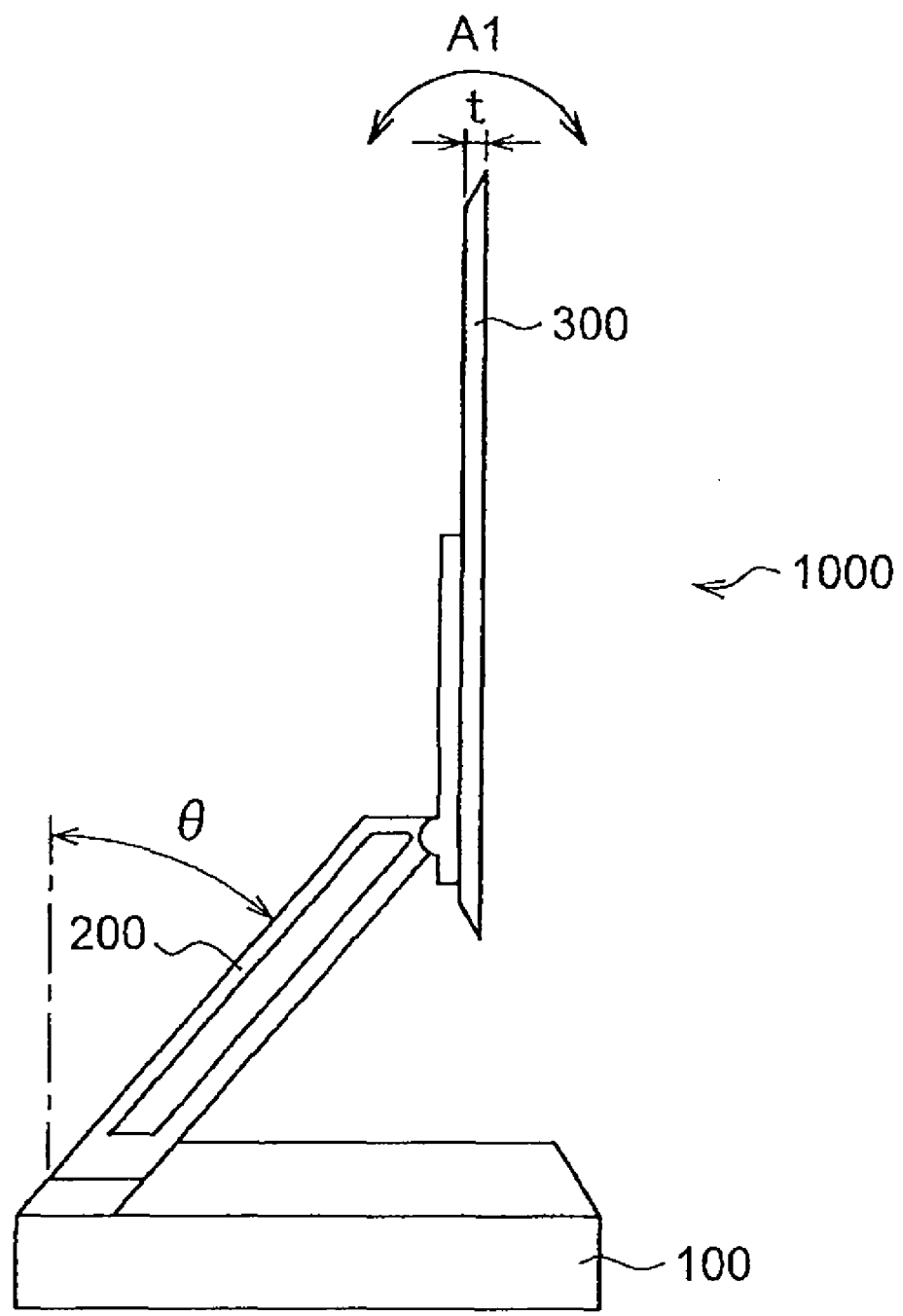
FIG. 2 is a schematic perspective view showing the display device seen from the front left side.

As shown in FIGS. 1A, 1B and 2, the display device 1000 of the present embodiment is configured by including a body stand portion 100, an arm portion (support portion) 200 and a display portion (indication display portion) 300. The display device 1000 is, for example, for receiving video of television broadcasting and displaying the video on a display screen 300a of the display portion 300.

The display portion 300 includes a display panel (organic EL panel) 320 which displays an image by using the phenomenon of organic electroluminescence (EL). The organic EL panel 320 is configured by having a plurality of organic EL elements which are self light-emitting elements and does not need a backlight, and thus, it can be configured to be sufficiently thin. As shown in FIG. 2, the thickness t of the display portion 300 of the present embodiment is suppressed to several mm (approximately 3 mm) or below, making it a low-profile panel with extremely thin thickness.

One arm portion 200 is provided at the back of the body stand portion 100 in a standing manner, upward from the body stand portion 100. When the display device 1000 is seen from the front side, the arm portion 200 is provided on the right side of the center of the body stand portion 100 in a lateral direction (horizontal direction) and is connected to the right side of the center of the display portion 300 in a lateral direction. As such, with the display device 1000 of the present embodiment, the arm portion 200 is provided on either of the right end side or the left end side of the center of the display device 300 in the lateral direction, and the display portion 300 is supported in a cantilever manner.

In case of a liquid crystal display, since a backlight is needed, the thickness of the display portion becomes thick and the weight becomes heavy. More particularly, when assuming a case where the display is used not as a display for a computer but as a display for displaying television video as in the present embodiment, to ensure image quality high enough for a television receiver, it is necessary to arrange more backlights compared to the display for a computer. Further, in addition to the backlights, it is necessary for the liquid crystal display to include an inverter for controlling the backlights. Thus, in case of the liquid crystal display, since the weight becomes heavy, it is necessary to increase the rigidity of the display portion including the arm portion to support the display portion in a cantilever manner, and thus, the complication of the structure and increase in weight are expected. Accordingly, supporting a liquid crystal display in a cantilever manner is not practical when considering the convenience of users, manufacturing cost and the like.

On the other hand, with the organic EL panel, since it is constituted with organic EL elements that are self light-emitting elements, it is not necessary to include a backlight or structural elements such as an inverter accompanying the backlight, and thus, it may be configured to be lightweight with only a thin glass panel. Therefore, according to the present embodiment, it becomes possible to configure the display portion 300 itself to be extremely light and to support the display portion 300 in a cantilever manner.

The display portion 300 is movable in back-and-forth directions with the connection part with the arm portion 200 being the center as shown in FIG. 2 with the arrow A1, and a user can set the tilt angle of the display portion 300 to a desired tilt angle.

In the display panel of a related art, a supporting member supporting the display panel supports, in case of supporting at one point, the display panel from the lower side at one point in the central part in the lateral direction. Further, in case of supporting at two points, the supporting members support the display panel from the lower side at positions near the both ends in the lateral direction of the display panel. In the present embodiment, the arm portion 200 is positioned not in the central part of the display portion 300 in the lateral direction and the display portion 300 is supported in a cantilever manner, and thus, the arm portion 200 is out of a user's view and the user can visually perceive only the display screen 300a. Thus, it becomes possible to give the impression to the user that the display portion 300 is floating over the body stand portion 100 without the arm portion 200. Accordingly, by supporting the display portion 300 in a cantilever manner, it becomes possible to make the user view only the display screen 300a independently.

Further, the base portion of the arm portion 200 does not need to be connected to the center of the body stand portion 100, and thus, the arm portion 200 can be arranged more freely. Accordingly, it becomes possible to determine the arranging position of the arm portion 200 on the body stand portion 100 in consideration of the internal structure, the board arrangement and the like of the body stand portion 100 and the freedom of design can be increased. Thus, it becomes possible to arrange the structural elements most efficiently in consideration of the internal structure of the body stand portion 100 and also to reduce the size of the display device 1000 to the minimum. Further, since the arm portion 200 is not positioned in the center of the body stand portion 100, a wide space which can be used effectively can be obtained on the upper surface of the body stand portion 100, and it becomes possible to freely arrange a display portion, operation buttons, a LED lamp and the like on the upper surface of the body stand portion 100.

Further, as shown in FIGS. 1A, 1B and 2, the arm portion 200 is provided, inclining from the back part of the body stand portion 100 to the rear side of the display portion 300. In FIG. 2, the inclination angle θ of the arm portion 200 with respect to the vertical direction is approximately 45° to 60°. Thereby, when the display portion 300 is seen from the front side, the arm portion 200 hides behind the display portion 300, and the arm portion 200 can be prevented from being viewed by the user. Accordingly, combined with the effect by positioning the arm portion 200 out of the center of the display portion 300, it can be made sure that the arm portion 200 is not visually perceived by the user.

As such, only the display portion 300 and the body stand portion 100 are seen in the view of the user and the arm portion 200 is almost out of view. Thus, it can be prevented that the user directly perceives the connection state of the display portion 300 and the body stand portion 100. Accordingly, it feels to the user as if the display portion 300 is floating in the air.

Further, as described above, in the structure of the present embodiment, the thickness of the display portion 300 is configured to be extremely thin such as a few mm, and thus, the user perceives the display portion 300 with an emphasized lightweight feeling. Accordingly, combined with the effect of the impression that the display portion 300 is floating in the air, the display portion 300 that gives the impression that it is floating and light-weighted is provided to the user.

This allows the user to view only the content being displayed on the display portion 300, which is being perceived as if it is floating in the air, and thus, the user can concentrate on the content being displayed without being distracted by other structural parts. Accordingly, it becomes possible to keep the good design at the same time as giving the impression to the user that the display screen 300a is floating in the air, and to provide the display device 1000 with the display screen 300a whose visibility is greatly improved.

[Structure of Body Stand Portion]

Figure 3:
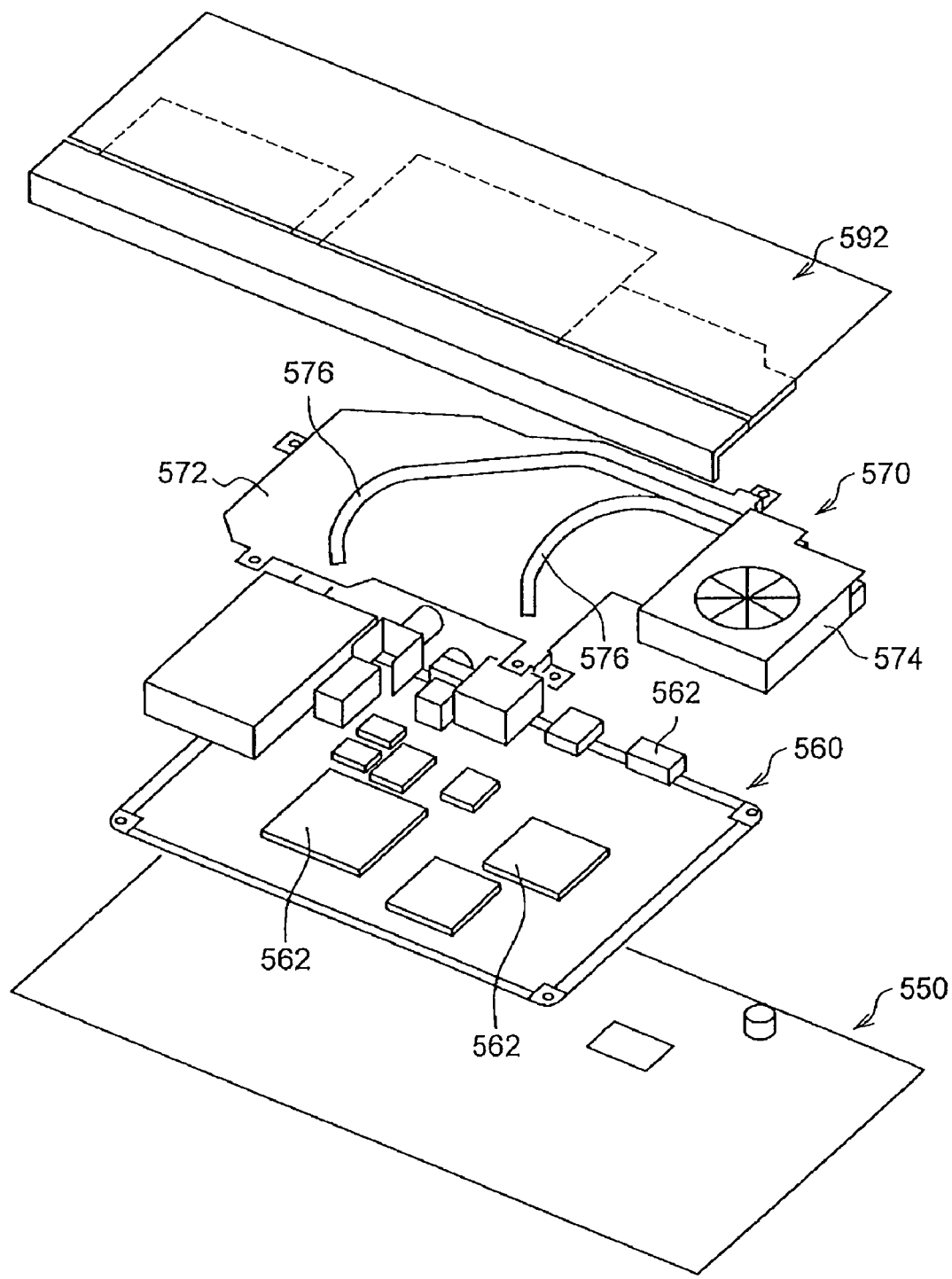
FIG. 3 is an exploded perspective view showing an internal structure of a body stand portion.

FIG. 3 is an exploded perspective view showing an internal structure of the body stand portion 100. Various terminals such as a tuner for satellite broadcast (broadcasting satellite (BS), communication satellite (CS)), terrestrial digital wave, a local area network (LAN), a high-definition multimedia interface (HDMI), a universal serial bus (USB) and like are embedded in the body stand portion 100 and, on the rear side, a rod antenna 104 (refer to FIG. 1B) for receiving the terrestrial digital wave is provided. Further, a speaker box, an operation button and the like are embedded in the body stand portion 100. As shown in FIG. 3, in the inside of the body stand portion 100, a bottom cover 550, a main board (O board) 560, a cooling unit 570 and a top cover block 592 are disposed in the order from the lower side.

Figure 4:
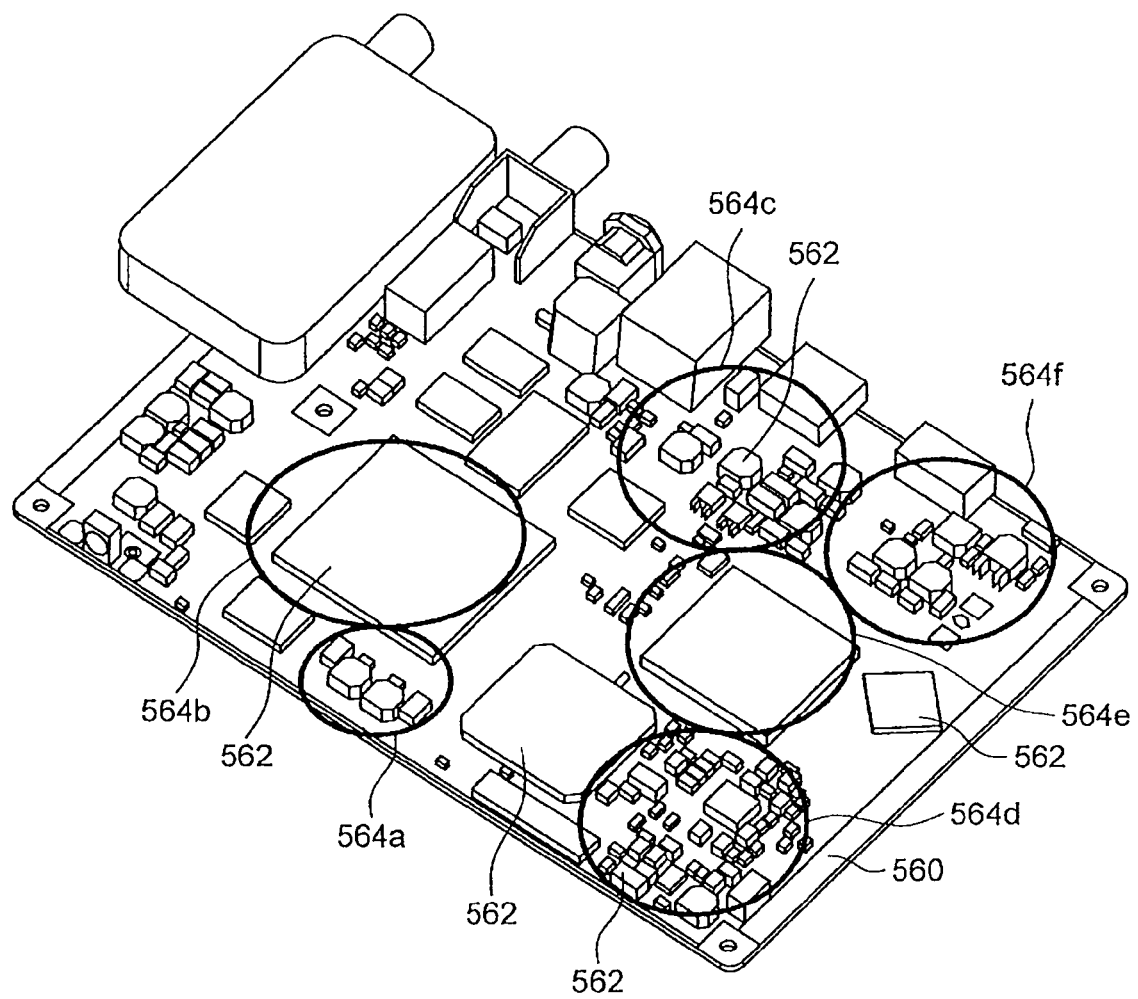
FIG. 4 is a perspective view showing the top surface of a main board.

FIG. 4 is a perspective view showing the top surface of the main board 560. On the top surface of the main board 560, a number of electronic components 562 are disposed. The six areas 564a, 564b, 564c, 564d, 564e and 564f shown in FIG. 4 indicate the areas where the heat release values from the electronic components 562 are particularly large.

Figure 5:
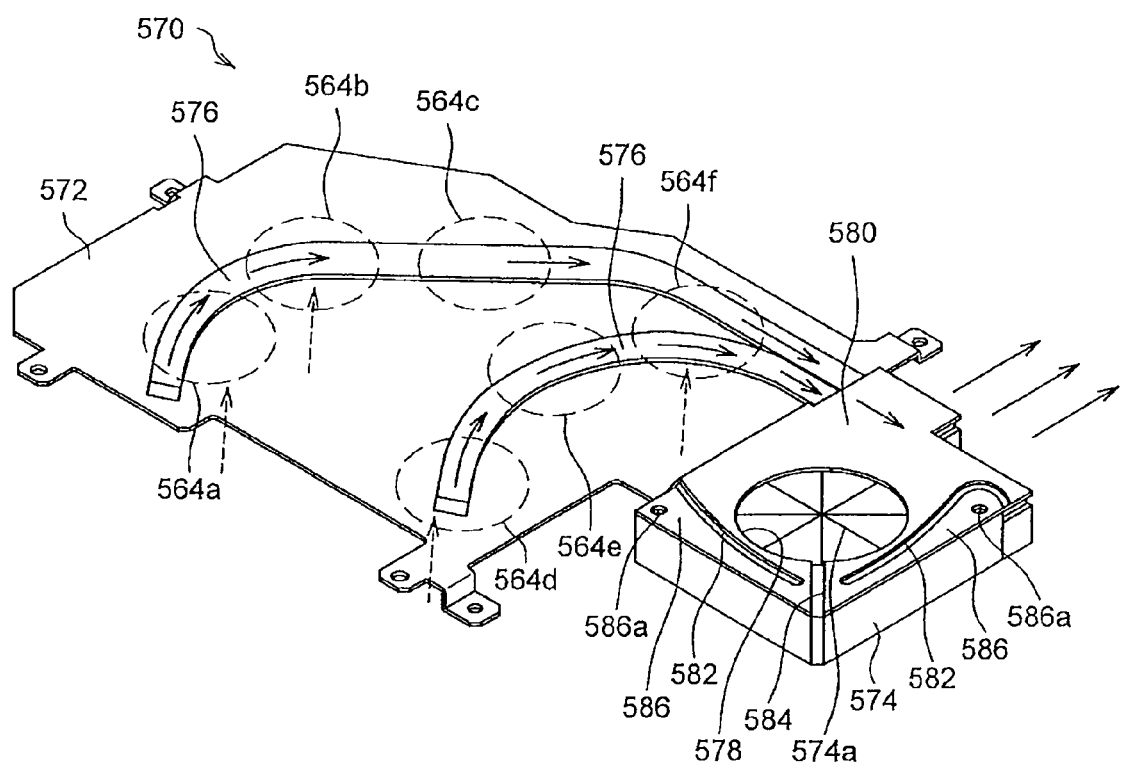
FIG. 5 is a schematic view showing a cooling unit disposed on the main board.

FIG. 5 shows the cooling unit 570 disposed on the main board 560. The cooling unit 570 is configured by integrating a heat sink 572 and a cooling fan 574.

Further, FIG. 5 shows the positions of the areas 564a to 564f of FIG. 4 in relation to the top surface of the heat sink 572. As shown in FIG. 5, two heat pipes 576 are provided on the positions corresponding to the areas 564a to 564f and the ends of the heat pipes 576 are connected to the cooling fan 574. The cooling fan 574 is configured by a centrifugal fan, and the air drawn in from the top and the bottom is discharged to the side and is discharged outside the body stand portion 100. The heat sink 572 and the heat pipes 576 are made of metal such as copper, aluminum or the like.

With the structure as described above, since the heat pipes 576 is so disposed as to run over the areas 546a to 546f of the main board 560 where the heat release values are large, the heat emitted by the electronic components 562 is transferred to the heat pipes 576 and is conveyed to the cooling fan 574 through the heat pipes 576. Accordingly, most of the heat emitted at the main board 560 can be efficiently conveyed to the cooling fan 574, and it becomes possible to efficiently emit the heat inside the body stand portion 100 to the outside.

Next, the fitting structure of the cooling fan 574 will be described. As shown in FIG. 5, a cooling fan fitting portion 580, which is a level higher than the surface on which the heat pipes 574 are provided, is provided on the heat sink 572. The cooling fan 574 is attached below the cooling fan fitting portion 580.

An opening 578 exposing blades 574a of the cooling fan 574 is provided in the cooling fan fitting portion 580. Further, two grooves 582 are provided on the cooling fan fitting portion 580 along its profile. Further, a groove 584 extending toward the opening 578 is provided at the corner of the cooling fan fitting portion 580. Incidentally, the groove 584 extending from the outer periphery and reaching the opening 578 may be so configured that the groove 584 does not reach the opening 578.

With the grooves 582 and the groove 584 provided, arms 586 are formed outside the grooves 582. The arms 586 can be elastically deformable around the fulcrums of the tips of the grooves 582.

Fitting holes 586a are provided at the tips of the two arms 586 for fitting the cooling fan 574. Screws, caulking pins or the like for fitting the cooling fan 574 to the tips of the arms 586 are inserted in the fitting holes 586a. This allows the cooling fan 574 to be fixed to the tips of the two arms 586, and the cooling fan 574 is fixed to the cooling fan fitting portion 580 only at the positions of the two fitting holes 586a.

Figure 6:
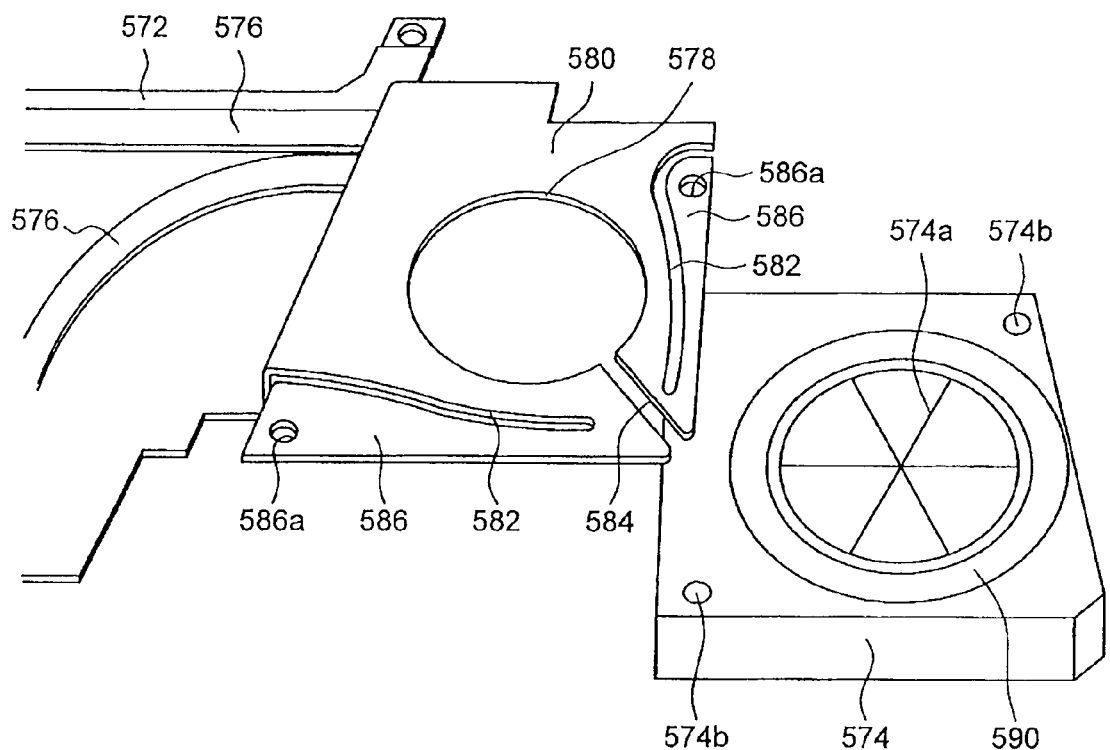
FIG. 6 is a schematic view showing a state where a cooling fan is removed from a cooling fan fitting portion.
Figure 7:
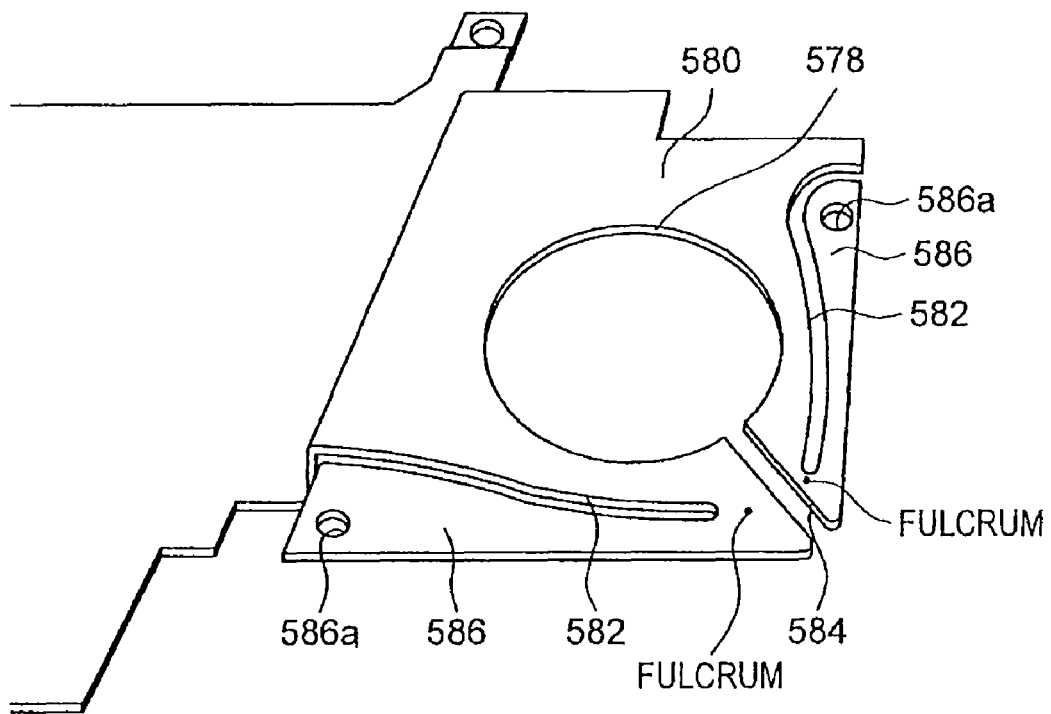
FIG. 7 is a schematic view showing the proximity of the cooling fan fitting portion of a heat sink.

FIG. 6 is a schematic view showing a state where the cooling fan 574 is removed from the cooling fan fitting portion 580 of the heat sink 572. Further, FIG. 7 is a schematic view showing the cooling fan fitting portion 580 in detail. As shown in FIG. 6, fitting holes 574b are provided at the two opposing corners of the cooling fan 574. The positions of the fitting holes 574b correspond to the positions of the fitting holes 586a of the arms 586 of the cooling fan fitting portion 580.

Further, as shown in FIG. 6, a ring-shaped cushion member 590 is inserted between the lower surface of the cooling fan fitting portion 580 and the cooling fan 574. The cushion member 590 is configured by, for example, a porous sponge, and is a vibration isolation material made of rubber, urethane or the like.

As shown in FIG. 7, providing the grooves 582 and 584 on the cooling fan fitting portion 580 makes the arms 586 function as cantilever beams which can bend around the fulcrums shown in FIG. 7. Accordingly, the vibration caused by driving the cooling fan 574 is absorbed by the bending of the arms 586. This suppresses the vibration of the cooling fan 574 and prevents the vibration from reaching the heat sink 572, and further, prevents the vibration from reaching the exterior material of the body stand portion 100 from the heat sink 572. Accordingly, it becomes possible to positively suppress the generation of sound resulting from the vibration of the heat sink 572, and the quietness of the display device 1000 can be improved.

Further, since the cushion member 590 exists between the cooling fan 574 and the cooling fan fitting portion 580, the vibration of the cooling fan 574 can also be absorbed by the cushion member 590. Further, since the cooling fan 574 and the cooling fan fitting portion 580 do not come into direct contact because of the cushion member 590, it becomes possible to suppress the generation of sound resulting from the contacting. Further, air can be prevented from leaking from the gap between the heat sink 572 and the cooling fan 574.

Figure 8:
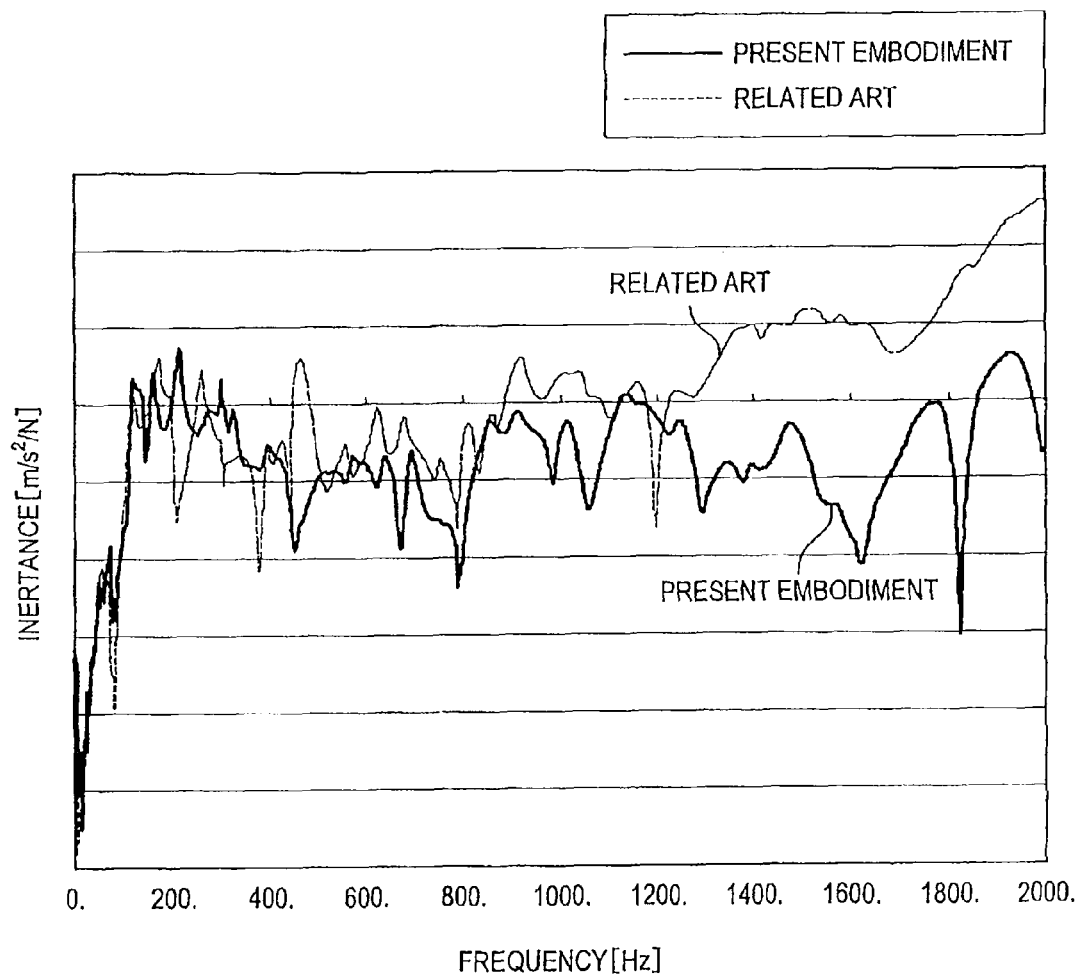
FIG. 8 is a characteristics graph showing the effect of noise reduction according to the present embodiment.

FIG. 8 is a characteristics graph showing the frequency characteristics of the generated sound where the cooling fan 574 is supported by the elastically deformable arms 586 (present embodiment) and where the cooling fan 574 is fitted directly to the heat sink 572 not provided with the arms 586 (related art).

As shown in FIG. 8, with the structure of the present embodiment where the heat sink 572 is provided with the grooves 582 and 584, the inertance can be reduced, particularly when the frequency is higher than 430 Hz. What is important for noise reduction is that reducing the sound of 708 Hz to 2818 Hz is effective for the reduction of dBA level. The sound with the target frequency is mostly caused by the vibration of the cooling fan 574. Accordingly, with the structure of the present embodiment, the vibration of the cooling fan 574 can be positively suppressed, and thus, it becomes possible to reduce the noise.

As described above, according to the present embodiment, by providing the cooling fan fitting portion 580 with the grooves 582 and 584 in a structure where the cooling fan 574 is fitted to the heat sink 572 provided with the heat pipes 576, the arms 586 to be fitted to the cooling fan 574 can be made elastic. Accordingly, the vibration of the cooling fan 574 can be absorbed by the bending of the arms 586, and the generation of the noise caused by the vibration of the cooling fan 574 can be positively suppressed with a simple structure.

It should be understood by those skilled in the art that various modifications, combinations, sub-combinations and alterations may occur depending on design requirements and other factors insofar as they are within the scope of the appended claims or the equivalents thereof.

For example, in the present embodiment, the arms 586 and the heat sink 572 are configured by the same material member, but they may be configured by different material members. Further, the present embodiment can be applied, not only to the heat sink 572, but also to a wide range of supporting members supporting the cooling fan 574, and by forming arms 586 on these supporting members similar to those of the present embodiment, the vibration of the cooling fan 574 can be effectively suppressed.

What is claimed is:

1. A heat dissipating structure for an electronic component, comprising:
   a circuit board having electronic components mounted thereon;
   a heat sink disposed facing the circuit board and including an arm, the arm branching from a main portion of the heat sink and elastically deformable in relation to the main portion of the heat sink; and
   a cooling fan attached to the arm and connected to the heat sink,
   wherein a groove is formed in proximity to an outer edge of the heat sink, and the arm is a predetermined portion of the heat sink between the groove and the outer edge of the heat sink.

2. The heat dissipating structure for an electronic component according to claim 1, comprising:
   a heat pipe disposed on the heat sink, wherein
   the cooling fan is located at an end portion of the heat pipe.

3. The heat dissipating structure for an electronic component according to claim 1, wherein
   the heat sink is connected with a plurality of the electronic components on the circuit board.

4. The heat dissipating structure for an electronic component according to claim 1, wherein
   an opening for exposing blades of the cooling fan is provided in the heat sink, and the groove is provided between the opening and the outer edge of the heat sink.

5. The heat dissipating structure for an electronic component according to claim 1, further comprising:
   a cushion member inserted between the heat sink and the cooling fan.

6. A display device including a body stand portion, a display portion, and a support portion provided in a standing manner on the body stand portion and which supports the display portion, the display device comprising:
   a circuit board provided inside the body stand portion and on which electronic components are mounted;
   a heat sink disposed facing the circuit board and including an arm, the arm branching from a main portion of the heat sink and elastically deformable in relation to the main portion of the heat sink; and
   a cooling fan attached to the arm and connected to the heat sink,
   wherein a groove is formed in proximity to an outer edge of the heat sink, and the arm is a predetermined portion of the heat sink between the groove and the outer edge of the heat sink.

7. The heat dissipating structure for an electronic component according to claim 1, wherein
   the heat sink includes a protruding portion and a cantilevered portion which includes the arm, the protruding portion protruding outwardly from a surface of the heat sink and the cantilevered portion cantilevering from a protruding end of the protruding portion, and
   the cooling fan is attached to a surface of the cantilevered portion and is connected to the heat sink.

8. The heat dissipating structure for an electronic component according to claim 1, wherein
   the heat sink includes a cooling fan fitting portion and a heat conduction portion, the cooling fan fitting portion lying in a plane that is situated higher than a plane on which the heat conduction portion lies, and
   the cooling fan is attached to a downward-facing surface of the cooling fan fitting portion and is connected to the heat sink.

9. A heat dissipating structure for an electronic component, comprising:
   a circuit board having electronic components mounted thereon;
   a heat sink disposed facing the circuit board and including an arm, the arm branching from a main portion of the heat sink and elastically deformable in relation to the main portion of the heat sink;
   a cooling fan attached to the arm and connected to the heat sink; and
   a cushion member inserted between the heat sink and the cooling fan.

10. A heat dissipating structure for an electronic component, comprising:
    a circuit board having electronic components mounted thereon;

a heat sink disposed facing the circuit board and including an arm, the arm branching from a main portion of the heat sink and elastically deformable in relation to the main portion of the heat sink; and a cooling fan attached to the arm and connected to the heat sink, wherein the heat sink includes a protruding portion and a cantilevered portion, the protruding portion protruding outwardly from a surface of the heat sink and the cantilevered portion cantilevering from a protruding end of the protruding portion, and the cooling fan is attached to a surface of the cantilevered portion and is connected to the heat sink.

11. A heat dissipating structure for an electronic component, comprising:

a circuit board having electronic components mounted thereon;

a heat sink disposed facing the circuit board and including an arm, the arm branching from a main portion of the heat sink and elastically deformable in relation to the main portion of the heat sink; and a cooling fan attached to the arm and connected to the heat sink, wherein the heat sink includes a cooling fan fitting portion and a heat conduction portion, the cooling fan fitting portion lying in a plane that is situated higher than a plane on which the heat conduction portion lies, and the cooling fan is attached to a downward-facing surface of the cooling fan fitting portion and is connected to the heat sink.

\* \* \* \* \*